United States Patent
Young et al.

(10) Patent No.: US 10,720,275 B2
(45) Date of Patent: Jul. 21, 2020

(54) DETENT ASSEMBLY

(71) Applicant: Starkey Laboratories, Inc., Eden Prairie, MN (US)

(72) Inventors: Christopher D. Young, Shorewood, MN (US); Sidney A. Higgins, Maple Grove, MN (US)

(73) Assignee: Starkey Laboratories, Inc., Eden Prairie, MN (US)

( * ) Notice: Subject to any disclaimer, the term of this patent is extended or adjusted under 35 U.S.C. 154(b) by 94 days.

(21) Appl. No.: 15/799,019

(22) Filed: Oct. 31, 2017

(65) Prior Publication Data

US 2019/0131046 A1 May 2, 2019

(51) Int. Cl.
| | |
|---|---|
| *H04R 25/00* | (2006.01) |
| *H01F 7/02* | (2006.01) |
| *H01H 5/02* | (2006.01) |
| *H01H 9/02* | (2006.01) |
| *H05K 5/02* | (2006.01) |
| *H01H 3/50* | (2006.01) |

(52) U.S. Cl.
CPC ............ *H01F 7/0205* (2013.01); *H01H 5/02* (2013.01); *H01H 9/0271* (2013.01); *H04R 25/602* (2013.01); *H04R 25/65* (2013.01); *H05K 5/0226* (2013.01); *H01H 2003/506* (2013.01); *H01H 2300/004* (2013.01)

(58) Field of Classification Search
CPC .. H01F 7/0205; H01H 9/0271; H04R 25/602; H04R 25/65; H05K 5/0226
USPC ............................................ 381/323; 24/303
See application file for complete search history.

(56) References Cited

U.S. PATENT DOCUMENTS

| | | | |
|---|---|---|---|
| 4,467,145 | A | 8/1984 | Borstel |
| 4,628,199 | A | 12/1986 | Mueller et al. |
| 6,630,878 | B2 | 10/2003 | Pan et al. |
| 6,812,816 | B1 | 11/2004 | Easton |

(Continued)

FOREIGN PATENT DOCUMENTS

| | | |
|---|---|---|
| DE | 3109049 A1 | 9/1982 |
| DE | 3706515 A1 | 9/1988 |

(Continued)

OTHER PUBLICATIONS

European Search Report for EP Application No. 18190336.0, dated Mar. 26, 2019, 8 pgs.

*Primary Examiner* — Phylesha Dabney
(74) *Attorney, Agent, or Firm* — Mueting Raasch Group

(57) ABSTRACT

Various embodiments of a detent assembly are disclosed. The detent assembly includes a base having a major surface, a first magnetic region, and a second magnetic region, where the first and second magnetic regions are disposed on or within the major surface. Each of the first and second magnetic regions includes a magnetic polarity. The detent assembly further includes an actuator connected to the base, where the actuator includes a major surface and a magnetic region disposed on or within the major surface. The magnetic region of the actuator includes the same magnetic polarity as the magnetic polarity of the first and second magnetic regions of the base. The base and the actuator are adapted to move relative to each other. Further, the first and second magnetic regions of the base repel the magnetic region of the actuator to define detent positions between the base and the actuator.

19 Claims, 6 Drawing Sheets

(56) References Cited

U.S. PATENT DOCUMENTS

| | | |
|---|---|---|
| 6,831,541 B1 | 12/2004 | Seidler |
| 6,922,123 B2 | 7/2005 | Lalonde et al. |
| 7,171,014 B2 | 1/2007 | Morales et al. |
| 7,934,291 B2 | 5/2011 | Prest |
| 8,180,084 B2 | 5/2012 | Higgins et al. |
| 8,780,549 B2 * | 7/2014 | Aldana ............... G06F 1/1626 |
| | | 361/679.41 |
| 8,899,636 B2 | 12/2014 | Fitzgerald et al. |
| 9,392,829 B2 * | 7/2016 | Manuello ............... A41F 1/002 |
| 2004/0252104 A1 | 12/2004 | Nakamura et al. |
| 2008/0044049 A1 | 2/2008 | Ho et al. |
| 2008/0199031 A1 | 8/2008 | Ho et al. |
| 2008/0303618 A1 | 12/2008 | Prest |
| 2010/0191224 A1 | 7/2010 | Butcher |
| 2012/0093349 A1 * | 4/2012 | Chua ................ H04R 25/602 |
| | | 381/323 |

FOREIGN PATENT DOCUMENTS

| | | |
|---|---|---|
| EP | 1874091 A2 | 1/2008 |
| EP | 1874091 A3 | 6/2008 |
| EP | 1962553 A2 | 8/2008 |
| EP | 1962553 A3 | 10/2011 |

\* cited by examiner

DETENT ASSEMBLY

BACKGROUND

Detent assemblies can be utilized in a variety of applications to provide tactile feedback to a user and switch control of electronic elements utilized in various applications. For example, in hearing devices and hearables such as headphones and hearing aids, common tactile detents found, e.g., on battery doors and rocker and slider switches rely on physical contact between two interfering elements. These elements can be metal or plastic and are designed to use interfering domes or arms that move across one another. Some of these types of detents require that such elements be stressed or compressed until they "pop" over a restriction and rest in a cleared, restrained position. These mechanisms require significant internal volume for the acting features to reside and closely-held tolerances to be effective. There are, however, practical limits as to how small mechanical detents can be manufactured. As features of these mechanisms are reduced in size, internal stresses increase but must be kept below the yield or ultimate strength of the materials used. In addition, smaller mechanisms require thinner wall sections that flex under load, which in turn can prematurely cause the mechanism to fail.

Some detent assemblies include pairs of magnetic components that define detent positions by an attractive force between the magnetic components. A magnetic flux between the pairs of magnetic components changes based upon the amount of overlap between magnetic regions on each of the magnetic components. These changes in magnetic flux define detent positions between the magnetic components.

SUMMARY

In general, the present disclosure provides various embodiments of a detent assembly. The assembly can include a base and an actuator connected to the base. The base and the actuator are adapted to move relative to each other. Further, first and second magnetic regions of the base repel a magnetic region of the actuator to define one or more detent positions between the base and the actuator.

In one aspect, the present disclosure provides a detent assembly that includes a base having a major surface, a first magnetic region, and a second magnetic region, where the first and second magnetic regions are disposed on or within the major surface, and further where each of the first and second magnetic regions includes a magnetic polarity. The detent assembly further includes an actuator connected to the base, where the actuator includes a major surface and a magnetic region disposed on or within the major surface, where the magnetic region of the actuator includes the same magnetic polarity as the magnetic polarity of the first and second magnetic regions of the base. The base and the actuator are adapted to move relative to each other. Further, the first and second magnetic regions of the base repel the magnetic region of the actuator to define detent positions between the base and the actuator.

In another aspect, the present disclosure provides a hearing device that includes a housing, a faceplate connected to the housing, a battery compartment including first and second sidewalls and an opening in the faceplate, and a battery door connected to the faceplate by a hinge. The battery door includes a closed position and an open position. When in the closed position, the battery door occludes the opening in the faceplate. Further when in the open position, the battery door allows access to a battery disposed in the battery door. The hearing device also includes a detent assembly connected to the battery compartment and the battery door. The detent assembly includes a base having a first magnetic region and a second magnetic region, where the first and second magnetic regions are disposed on or within the first sidewall of the battery compartment, and further where each of the first and second magnetic regions includes a magnetic polarity. The detent assembly also includes an actuator having a magnetic region disposed on or within a sidewall of the battery door, where the magnetic region of the actuator includes the same magnetic polarity as the magnetic polarity of the first and second magnetic regions of the base. The base and the actuator are adapted to move relative to each other. Further the first and second magnetic regions of the base repel the magnetic region of the actuator to define detent positions between the base and the actuator.

All headings provided herein are for the convenience of the reader and should not be used to limit the meaning of any text that follows the heading, unless so specified.

The terms "comprises" and variations thereof do not have a limiting meaning where these terms appear in the description and claims. Such terms will be understood to imply the inclusion of a stated step or element or group of steps or elements but not the exclusion of any other step or element or group of steps or elements.

In this application, terms such as "a," "an," and "the" are not intended to refer to only a singular entity, but include the general class of which a specific example may be used for illustration. The terms "a," "an," and "the" are used interchangeably with the term "at least one." The phrases "at least one of" and "comprises at least one of" followed by a list refers to any one of the items in the list and any combination of two or more items in the list.

The phrases "at least one of" and "comprises at least one of" followed by a list refers to any one of the items in the list and any combination of two or more items in the list.

As used herein, the term "or" is generally employed in its usual sense including "and/or" unless the content clearly dictates otherwise.

The term "and/or" means one or all of the listed elements or a combination of any two or more of the listed elements.

As used herein in connection with a measured quantity, the term "about" refers to that variation in the measured quantity as would be expected by the skilled artisan making the measurement and exercising a level of care commensurate with the objective of the measurement and the precision of the measuring equipment used. Herein, "up to" a number (e.g., up to 50) includes the number (e.g., 50).

Also herein, the recitations of numerical ranges by endpoints include all numbers subsumed within that range as well as the endpoints (e.g., 1 to 5 includes 1, 1.5, 2, 2.75, 3, 3.80, 4, 5, etc.).

These and other aspects of the present disclosure will be apparent from the detailed description below. In no event, however, should the above summaries be construed as limitations on the claimed subject matter, which subject matter is defined solely by the attached claims, as may be amended during prosecution.

BRIEF DESCRIPTION OF THE DRAWINGS

Throughout the specification, reference is made to the appended drawings, where like reference numerals designate like elements, and wherein.

DETAILED DESCRIPTION

Figure 1:
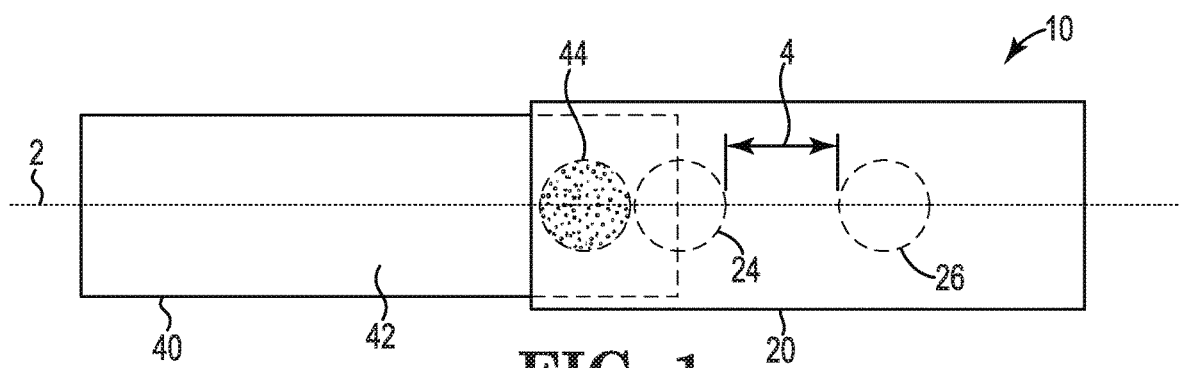
FIG. 1 is a schematic plan view of one embodiment of a detent assembly.

In general, the present disclosure provides various embodiments of a detent assembly. The assembly can include a base and an actuator connected to the base. The base and the actuator are adapted to move relative to each other. Further, first and second magnetic regions of the base repel a magnetic region of the actuator to define one or more detent positions between the base and the actuator.

Currently-available detent assemblies can include interfacing ribs and other types of structures that may take up limited space that instead could be utilized for other components such as electronic devices. Further, some detent assemblies do not provide consistent tactile feedback to a user as the various components of the assemblies can wear during use. As features of these assemblies are reduced in size, internal stresses increase but must be kept below the yield or ultimate strength of the materials used. In addition, smaller mechanisms require thinner wall sections that flex under load, which in turn can prematurely cause the mechanism to fail.

One or more embodiments of detent assemblies described herein can provide various advantages over currently-available assemblies. For example, by using opposing magnetic regions or elements disposed on or embedded within sections of a device, the detent assembly can provide consistent tactile feedback to a user without taking up limited volume or space within a device that is needed for other components. Further, one or more detent assemblies described herein can provide tactile feedback to a user without the need for tightly toleranced assemblies. One or more embodiments of detent assemblies described herein can also include components that are spaced apart from adjacent components, thereby further reducing wear of the assemblies.

The various embodiments of detent assemblies described herein can be utilized in any device or system. For example, one or more embodiments of detent assemblies can be utilized as rocker switches, pushbutton switches, slider switches, actuator or holding devices, magnetic couplers, and tactile rotary volume controls. Further, the various embodiments of detent assemblies can be utilized with any suitable device, e.g., hearing devices, computers, smartphones, etc.

FIGS. 1-4 are various views of one embodiment of a detent assembly 10. The assembly 10 includes a base 20 and an actuator 40. The base includes a major surface 22, a first magnetic region 24 and a second magnetic region 26. The first and second magnetic regions 24, 26 are disposed on or within the major surface 22. In one or more embodiments, each of the first and second magnetic regions 24, 26 includes a magnetic polarity, e.g., a north or south polarity. Further, the actuator 40 includes a major surface 42 and a magnetic region 44 disposed on or within the major surface. Magnetic region 44 includes a magnetic polarity. The base 20 and the actuator 40 are adapted to move relative to each other in any suitable motion, e.g., translationally, rotationally, etc. Further, the major surface 22 of the base 20 faces the major surface 42 of the actuator 40 when the base and actuator are engaged. In one or more embodiments, the first and second magnetic regions 24, 26 of the base 20 repel the magnetic region 44 of the actuator 40 to define one or more detent positions between the base and the actuator.

Figure 2:
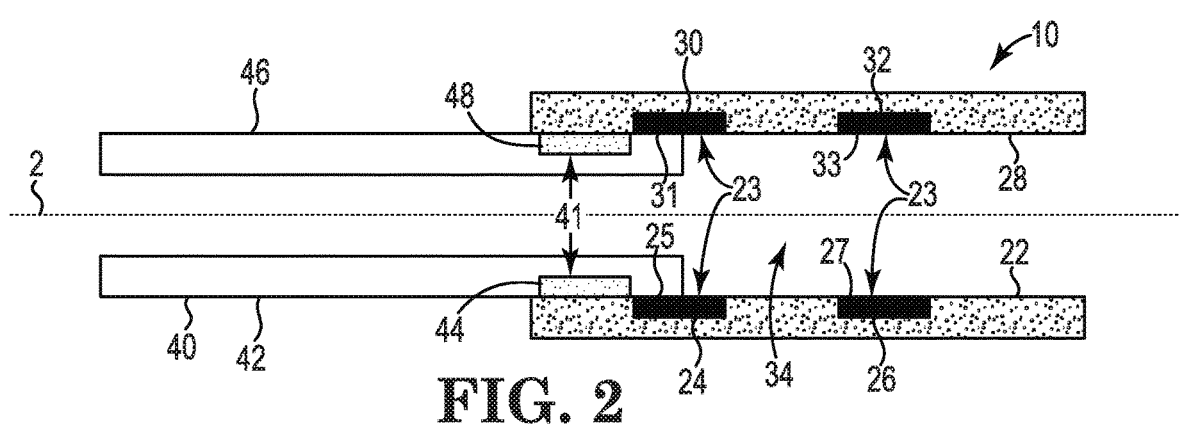
FIG. 2 is a schematic top cross-section view of the detent assembly of FIG. 1 with the assembly in a first detent position.

The base 20 of the assembly 10 can form a portion or portions of any suitable device or system. Further, the major surface 22 of the base 20 can take any suitable shape or shapes and have any suitable dimensions. In one or more embodiments, the base 20 also includes a second major surface 28 as shown in FIG. 2.

The base 20 further includes the first and second magnetic regions 24, 26. The magnetic regions 24, 26 can be disposed in any suitable location on or within the major surface 22. In one or more embodiments, the base 20 can also include third and fourth magnetic regions 30, 32 disposed on or within the second major surface 28. Although depicted as including four magnetic regions (collectively referred to as magnetic regions 23), the base 20 can include any suitable number of magnetic regions.

The magnetic regions 23 can be disposed in any suitable relationship relative to each other. In one or more embodiments, the first magnetic region 24 is aligned with the third magnetic region 30 along an axis that is orthogonal to a surface 25 of the first magnetic region and a surface 31 of the third magnetic region. Further, in one or more embodiments, the second magnetic region 26 is aligned with the fourth magnetic region 32 along an axis that is orthogonal to a surface 27 of the second magnetic region and a surface 33 of the fourth magnetic region.

The magnetic regions 23 can include any suitable magnetic material or materials, e.g., permanent magnetic material, ferromagnetic or ferrous material, and electromagnetic magnetic material. All of the magnetic regions 23 of the base 20 can include the same magnetic material. In one or more embodiments, one of the magnetic regions 23 can include a magnetic material that is different from one or more of the other magnetic regions.

Each of the magnetic regions 23 can take any suitable shape or combination of shapes and have any suitable dimensions. In one or more embodiments, a magnetic region of the magnetic regions 23 can take a shape that is the same as one or more of the magnetic regions. In one or more embodiments, a magnetic region of the magnetic regions 23 can take a shape that is different from a shape of one or more of the other magnetic regions.

Further, the magnetic regions 23 can be spaced apart any suitable distance. For example, as shown in FIGS. 1-4, the first magnetic region 24 is spaced apart from the second magnetic region 26 a distance 4. The distance 4 can be any suitable distance such that the space between the first and second magnetic regions 24, 26 provide at least one detent position as is further described herein.

The magnetic regions 23 can have any suitable overall magnetic polarity, e.g., either a north or south polarity. In one or more embodiments, the first magnetic region 24 has the same polarity as the second magnetic region 26. In one or more embodiments, the first magnetic region 24 has a polarity that is different from the polarity of the second magnetic region 26. Similarly, the third magnetic region 30 can have the same polarity or the opposite polarity as the polarity of the fourth magnetic region 32. In one more embodiments, each of the magnetic regions 23 of the base 20 can have the same magnetic polarity. In one or more embodiments, the first magnetic region 24 and the second magnetic region 26 can have a first magnetic polarity, and the third magnetic region 30 and the fourth magnetic region 32 can have a second magnetic polarity. The first magnetic polarity can be the same as or different from the second magnetic polarity.

Each of the magnetic regions 23 of the base 20 can have any suitable magnetic flux. In one or more embodiments, the magnetic flux of one of the magnetic regions 23 is the same as the magnetic flux of one or more of the other magnetic regions. In one or more embodiments, the magnetic flux of one of the magnetic regions 23 is greater than or less than the magnetic flux of the other magnetic regions. The magnetic flux of magnetic regions can be tailored using any suitable technique or combination of techniques to provide a desired tactile feel to the user. For example, in one or more embodiments, a thickness of one or more of the magnetic regions 23 can be selected to provide a desired magnetic flux. Further, in one or more embodiments, the material utilized to form one or more of the magnetic regions 23 can be selected to provide a desired magnetic flux.

Connected to the base 20 is the actuator 40. The actuator 40 may be connected to the base 20 using any suitable technique or techniques. For example, the base 20 can include a cavity or recess 34 that is shaped to receive the actuator 40 within the cavity. The actuator 40 can remain connected to the base 20 using any suitable technique or techniques. For example, although not shown, the actuator 40 can be connected to the base 20 utilizing one or more tabs and slots. In one or more embodiments, the actuator 40 can be connected to the base 20 using one or more hinges. Further, in one or more embodiments, the actuator 40 may be friction fit within the cavity 34 of the base 20. The actuator 40 can be connected to the base 20 such that any suitable space is formed between a major surface 42 of the actuator and the major surface 22 of the base. Further, the actuator 40 can be adapted such that any suitable space is formed between a second major surface 46 of the actuator and the second major surface 28 of the base 20. In one or more embodiments, one or more portions of the major surfaces 42, 46 of the actuator 40 can be in contact with one or more portions of the major surfaces 22, 28 of the base 20.

As shown in FIGS. 1-4, the major surface 22 of the base 20 faces the major surface 42 of the actuator 40, and the second major surface 28 of the base faces the second major surface 46 of the actuator when the base is engaged with the actuator, i.e., when the detent assembly 40 is disposed in a detent position.

The major surface 42 and the second major surface 46 of the actuator 40 can form any suitable portion or portions of any suitable device. Further, the major surfaces 42, 46 of the actuator 40 can take any suitable shape or shapes and have any suitable dimensions.

The actuator 40 includes the magnetic region 44 disposed on or within the major surface 42. In one or more embodiments, the actuator 40 includes a second magnetic region 48 disposed on or within the second major surface 46 of the actuator. Although depicted as including two magnetic regions 42, 48 (collectively magnetic regions 41), the actuator 40 can include any suitable number of magnetic regions. The magnetic regions 41 of the actuator 40 can include any suitable magnetic material or materials and have any suitable characteristics, e.g., the same materials and characteristics described herein regarding the magnetic regions 23 of the base 20. Further, the magnetic regions 41 of the actuator 40 can be disposed in any suitable location or locations on or within the major surfaces 42, 46 of the actuator.

The magnetic regions 41 of the actuator 40 can each have any suitable polarity. In one or more embodiments, the magnetic regions 41 can have the same magnetic polarity or different polarities. Further, the magnetic regions 41 of the actuator 40 can have the same or different magnetic polarities as the magnetic polarities of the magnetic regions 23 of the base 20. In one or more embodiments, each of the magnetic regions 23 of the base 20 and the magnetic regions 41 of the actuator 40 can have the same magnetic polarity. In one or more embodiments, each of the first and second magnetic regions 24, 26 of the base 20 and the magnetic region 44 of the actuator 40 can have a first magnetic polarity, and each of the third and fourth magnetic regions 30, 32 of the base and the second magnetic region 48 of the actuator can have a second magnetic polarity. The first magnetic polarity can be the same as or different from the second magnetic polarity.

The base 20 and the actuator 40 are adapted to move relative to each other along any suitable path or direction. For example, in the embodiment illustrated in FIGS. 1-4, the base 20 and the actuator 40 move relative to each other along a translation axis 2 in a linear or translational motion. Further, in one or more the embodiments, the base 20 and the actuator 40 can move relative to each other rotationally along a curved direction about at least one axis of rotation (see, e.g., detent assembly 100 of FIGS. 5-11).

Figure 3:
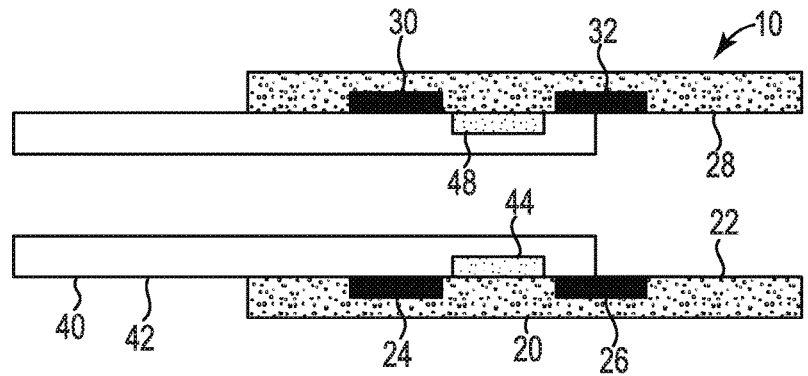
FIG. 3 is a schematic top cross-section view of the detent assembly of FIG. 1 with the assembly in a second detent position.
Figure 4:
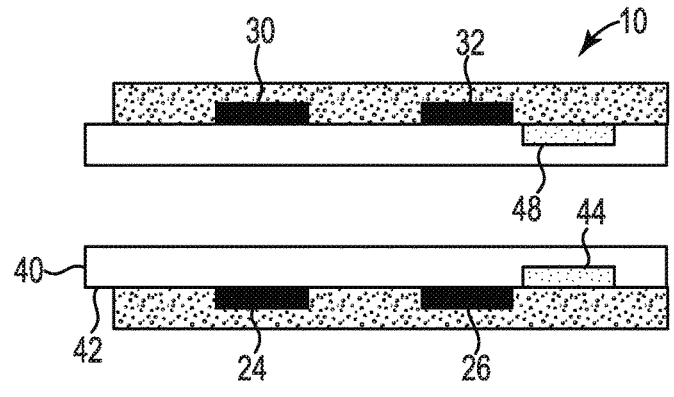
FIG. 4 is a schematic top cross-section view of the detent assembly of FIG. 1 with the assembly in a third detent position.

As mentioned herein, the various magnetic regions of the actuator 40 and the base 20 can have the same polarity such that these magnetic regions repel each other. For example, when the first and second magnetic regions 24, 26 of the base 20 have the same polarity as the magnetic region 44 of the actuator 40, the first and second magnetic regions of the base repel the magnetic region of the actuator to define detent positions between the base and the actuator. Any suitable number of detent positions may be provided between the base 20 and the actuator 40. In the embodiment illustrated in FIGS. 1-4, the detent assembly 10 includes a first detent position as illustrated in FIG. 2, a second detent position as illustrated in FIG. 3, and a third detent position as illustrated in FIG. 4. Although depicted as including three detent positions, the detent assembly 10 can include any suitable number of detent positions.

Figure 12:
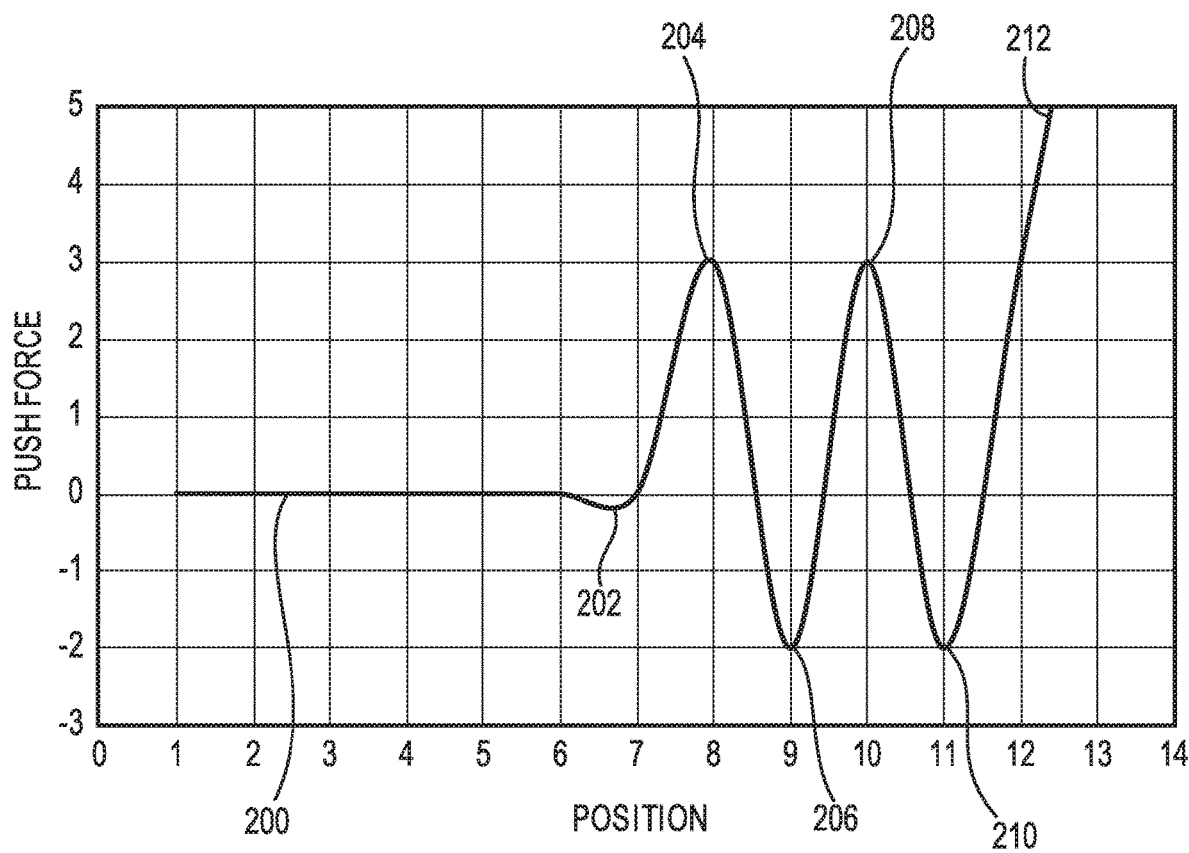
FIG. 12 is a graph of push force versus position that is representative of the various detent positions of the detent assembly of FIG. 1.

FIG. 12 is a graph of push or repulsive force versus position in arbitrary units that is representative of the first, second, and third detent positions of detent assembly 10. As shown in FIG. 12, curve 200 includes a first portion 202 that indicates the first detent position of the detent assembly 10. As magnetic region 44 approaches first magnetic region 24, the force required to move actuator 40 beyond first magnetic region 24 increases until magnetic region 44 passes portion 204 of the curve 200, which is the maximum repulsive force between magnetic region 44 and first magnetic region 24. As the magnetic region 44 is manipulated beyond first magnetic region 24, the repulsive force between these two regions and a repulsive force between the magnetic region 44 and the second magnetic region 26 defines the second detent position at portion 206 of the curve 200. The actuator 40 can be further manipulated toward the second magnetic region 26 of the base 20 to overcome the repulsive force between the magnetic region 44 and the second magnetic region 26 beyond portion 208 until the actuator assembly 10 is disposed in the third detent position as represented by portion 210 of the curve 200. Portion 212 of the curve represents a mechanical stop that can be disposed between the base 20 and the actuator 40 that prevents the actuator from being manipulated such that the magnetic region 44 of the actuator moves away from the first and second magnetic regions 242 of the base 20.

As shown in FIG. 2, when the detent assembly 10 is in the first detent position, the first magnetic region 24 of the base 20 is disposed between the magnetic region 44 of the actuator 40 and the second magnetic region 26 of the base as projected in a plane parallel to surfaces of the magnetic regions (i.e., a plane parallel to the plane of FIG. 1). The repulsive force between the first magnetic region 24 of the base 20 and the magnetic region 44 of the actuator 40 prevents the actuator from being moved relative to the base along the translation axis 2 until a force applied to either the base or the actuator is greater than the repulsive force between such magnetic regions. This repulsive force between the first magnetic region 24 of the base 20 and the magnetic region 44 of the actuator 40 provides the user with a tactile stimulus that indicates the relative position between the base and the actuator. In embodiments where the actuator 40 includes a second magnetic region 48, a repulsive force between such magnetic region and the third magnetic region 30 of the base 20 also provides a tactile stimulus to the user that indicates that the detent assembly 10 is in the first detent position. When in the first detent position as shown in FIG. 2, the third magnetic region 30 of the base 20 is disposed between the second magnetic region 48 of the actuator 40 and the fourth magnetic region 32 of the base as projected in a plane parallel to surfaces of the magnetic regions (i.e., a plane parallel to the plane of FIG. 1).

When the detent assembly 10 is disposed in the second detent position as shown in FIG. 3, the magnetic region 44 of the actuator 40 is disposed between the first and second magnetic regions 24, 26 of the base 20. To position the detent assembly 10 in the second detent position, the user applies a force to either the base 20 or the actuator 40 to overcome the repulsive force between the first magnetic region 24 of the base 20 and the magnetic region 44 of the actuator 40 such that the actuator can be moved relative to the base beyond the first magnetic region and along the translation axis 2. Once the magnetic region 44 the actuator 40 is positioned between the first magnetic region 24 and the second magnetic region 26 of the base 20, a repulsive force between these magnetic regions positions the actuator in the second detent position and provides the user with a tactile stimulus. Further, when the actuator 40 includes the second magnetic region 48, such region is disposed between the third and fourth magnetic regions 30, 32 of the base 20 when the detent assembly is disposed in the second detent position. The repulsive force between the second magnetic region 48 and the third and fourth magnetic regions 30, 32 also provides a tactile stimulus to the user that the detent assembly 10 is in the second detent position.

As shown in FIG. 4, the detent assembly 10 includes the third detent position. When in the third detent position, the second magnetic region 26 of the base 20 is disposed between the first magnetic region 24 of the base and the magnetic region 44 of the actuator 40. Further, when in the third detent position, the fourth magnetic region 32 of the base 20 is disposed between the third magnetic region 30 of the base and the second magnetic region 48 of the actuator 40. Repulsive forces between the magnetic region 44 of the actuator 40 and the second magnetic region 26 of the base, and between the second magnetic region 48 of the actuator and the fourth magnetic region 32 of the base provide a tactile stimulus to the user that indicates that the assembly 10 is in the third detent position.

Any suitable technique or techniques can be utilized to form the detent assembly 10. In one or more embodiments, a molding process can be utilized to form one or both of the base 20 and the actuator 40. In such molding processes, recesses or receptacles can be formed in major surfaces of one or both of the base 20 and the actuator 40 that are adapted to receive magnetic regions. Such magnetic regions can be disposed and retained within these recesses using any suitable technique or techniques, e.g., adhering, bonding, mechanically fastening, etc. Further, insert-molding processes can be utilized to embed the magnetic regions in major surfaces of one or both of the base 20 and the actuator 40. For example, polymer-bonded magnets that include composite materials of a polymeric matrix with embedded hard magnetic filler particles can be utilized to form the magnetic regions of the detent assembly 10. Such polymer-bonded magnets may be printed or deposited on major surfaces of the base 20 and the actuator 40 using any suitable technique or techniques. In one or more embodiments, polymer-bonded magnets can be formed during molding of the base 20 and the actuator 40 as an integral part of the base. Once these polymer-bonded magnets are disposed on or in major surfaces of the detent assembly 10, such magnets can be magnetized using any suitable technique or techniques. For example, in one or more embodiments, magnetic coils can be integrated into the mold utilized to form the detent assembly 10.

As mentioned herein, the various embodiments of detent assemblies can be utilized with any suitable device or system. For example, FIGS. 5-11 are various views of one embodiment of a hearing device 100. The hearing device 100 can include any suitable hearing device, e.g., a hearing assistance device that includes a hearing aid such as behind-the-ear (BTE), in-the-ear (ITE), in-the-canal (ITC), or completely-in-the-canal (CIC) type hearing aid. It is understood that behind-the-ear type hearing aids may include devices that reside substantially behind the ear or over the ear. Such devices may include hearing aids with receivers associated with the electronics portion of the behind-the-ear device, or hearing aids of the type having receivers in the ear canal of the wearer. Such devices are also known as receiver-in-the-canal (RIC) or receiver-in-the-ear (RITE) hearing assistance devices. The present subject matter may additionally be used in consumer electronic wearable audio devices having various functionalities. It is understood that other devices not expressly stated herein may also be used in conjunction with the present subject matter.

While depicted as including one hearing device 100, two or more hearing assistance devices can be utilized. For example, in one or more embodiments, the hearing device 100 can include a left hearing assistance device that is adapted to be acoustically connected to a wearer's left ear and a right hearing assistance device that is adapted to be acoustically connected to the wearer's right ear.

Figure 7:
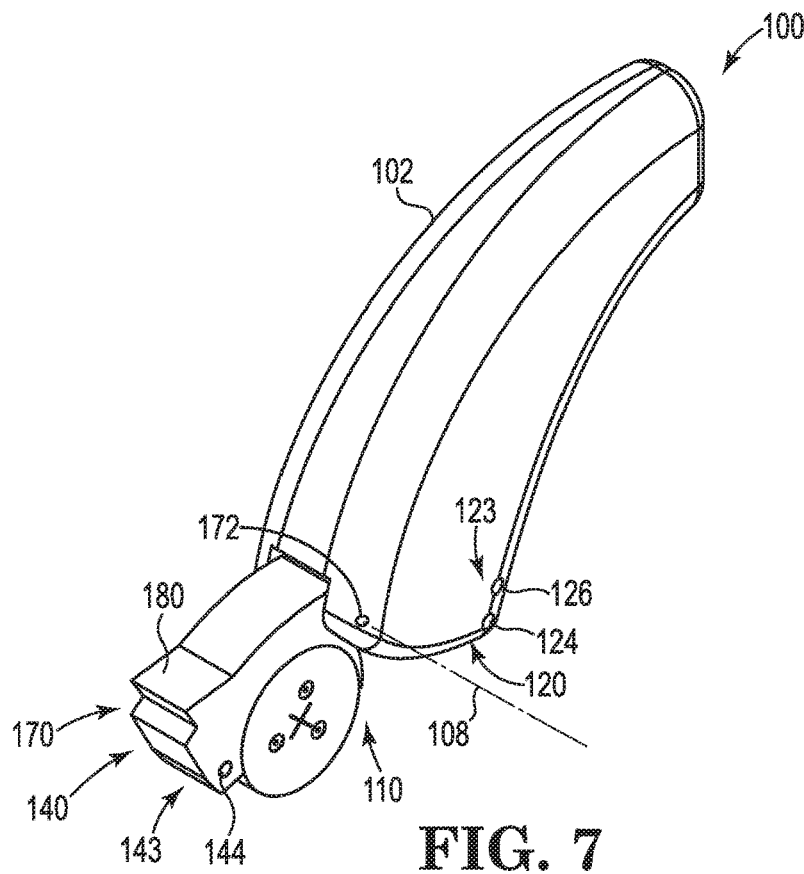
FIG. 7 is a right-side perspective view of the hearing device of FIG. 5.
Figure 9:
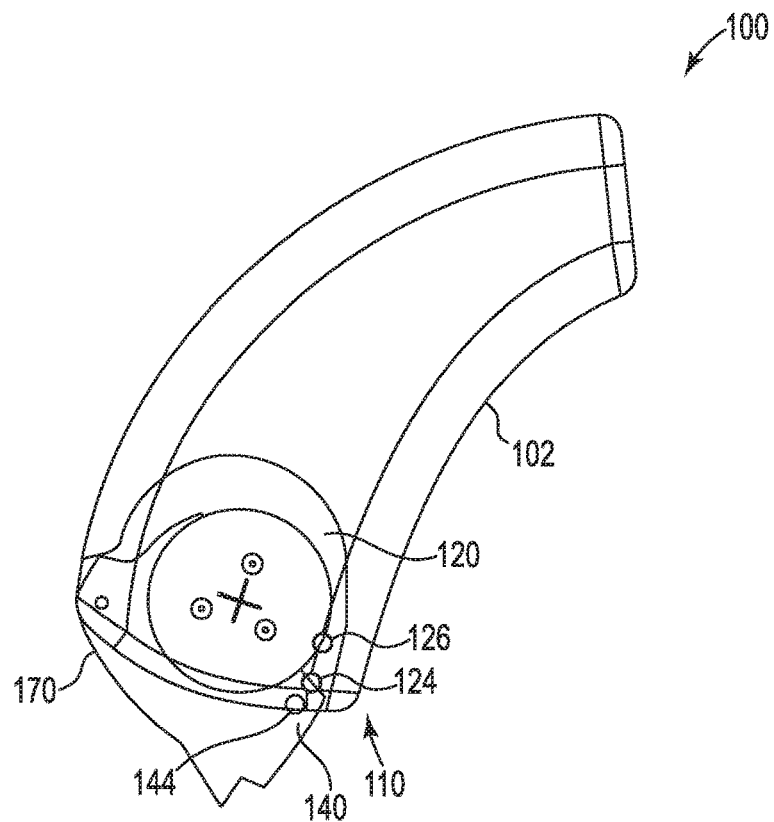
FIG. 9 is a plan view of the hearing device of FIG. 5 with the detent assembly in a first detent position.
Figure 10:
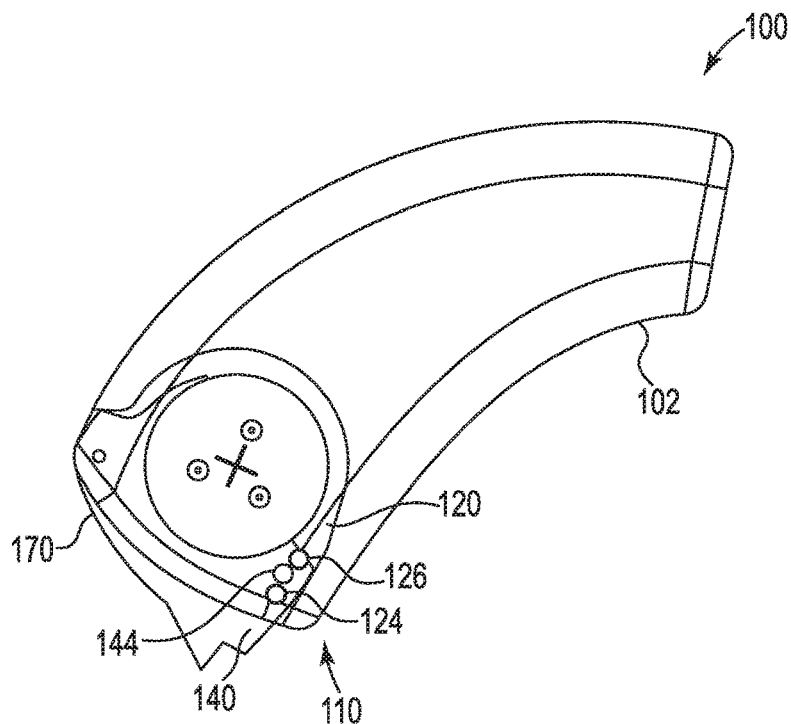
FIG. 10 is a plan view of the hearing device of FIG. 5 with the detent assembly in a second detent position.

The hearing device 100 includes a housing 102, an optional faceplate 160 connected to the housing, and a battery compartment 162 including first and second side walls 164, 166 and an opening 168 in the faceplate. For purposes of illustration, an outer surface of the housing 102 is not shown in FIGS. 9-11 such that various elements disposed at least partially within the housing can be depicted. The hearing device 100 also includes a battery door 170 connected to the faceplate 160 by a hinge 172 (FIG. 7). The battery door 170 includes a closed position (FIG. 11), an open position (FIGS. 7 and 9), and an intermediate position (FIG. 10). When in the intermediate position or the closed position, the battery door 170 substantially occludes the opening 168 and the faceplate 160. As used herein, the term "substantially occludes" means that the battery door 170 covers the opening 168 in the faceplate 160. Further, when in the open position, the battery door 170 allows access to a battery 194 disposed in the battery door.

The hearing device 100 also includes a detent assembly 110 (FIGS. 7-11) connected to the battery compartment 162 and the battery door 170. Any suitable detent assembly can be utilized with the hearing device 100, e.g., detent assembly 10 of FIGS. 1-4. All of the design considerations and possibilities regarding the detent assembly 10 of FIGS. 1-4 apply equally to the detent assembly 110 of FIGS. 5-11.

Figure 5:
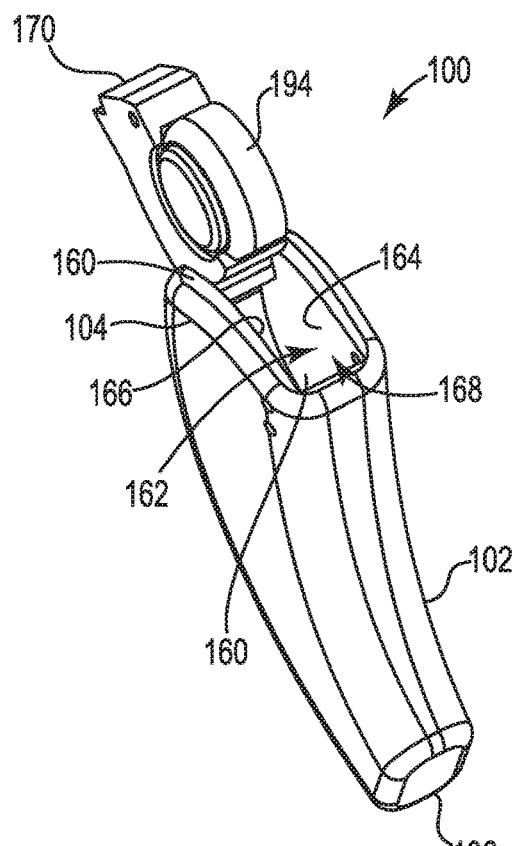
FIG. 5 is a schematic perspective view of one embodiment of a hearing device that includes a detent assembly.
Figure 6:
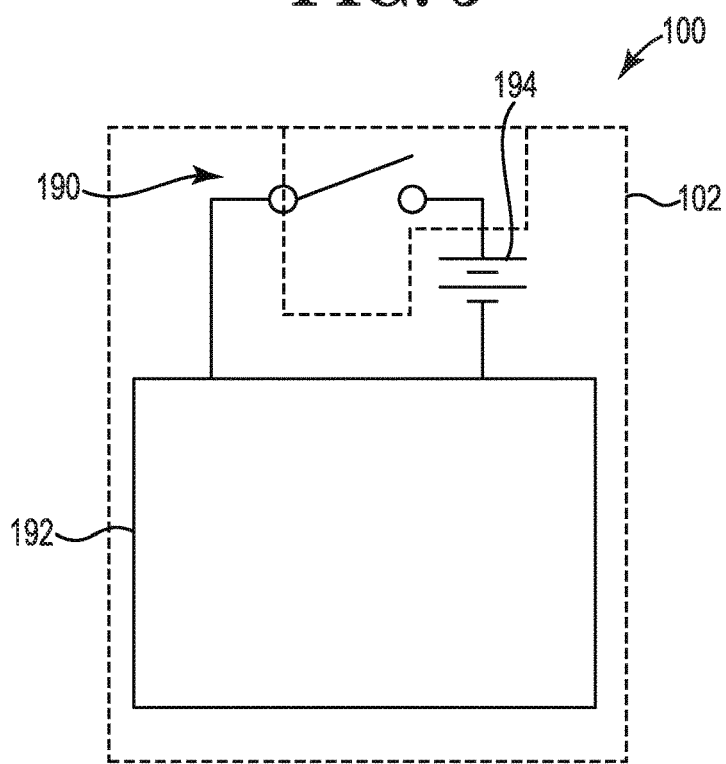
FIG. 6 is a schematic cross-section view of a housing of the hearing device of FIG. 5.

The housing 102 can take any suitable shape or shapes and have any suitable dimensions. In one or more embodiments, the housing 102 can take a shape that can conform to at least a portion of the ear of the patient. Further, the housing 102 can include any suitable material or combination of materials, e.g., silicone, urethane, acrylates, flexible epoxy, acrylated urethane, injection-molded plastics such as nylon, and combinations thereof. The housing 102 extends between a first end 104 and a second end 106 of the housing (FIG. 5).

Connected to the first end 104 of the housing 102 is the optional faceplate 160. Any suitable technique or techniques can be utilized to connect the faceplate 160 to the housing 102. The faceplate 160 can include any suitable faceplate. In one or more embodiments, the faceplate 160 can optionally include a status indicator light, a microphone inlet port, and a volume control. The faceplate 160 can also include a vent port (not shown). The faceplate 160 can include any suitable material or materials. In one or more embodiments, the faceplate 160 can include the same material or materials utilized to form the housing 102. In one or more embodiments, the hearing device 100 does not include a faceplate 160 such that the opening 168 of the battery compartment 162 forms the first end 104 of the housing 102.

Disposed in the faceplate 160 is the battery compartment 162, which includes the first sidewall 164 and the second sidewall 166. The battery compartment 162 also includes the opening 168 disposed in the faceplate 160. The battery compartment 162 can take any suitable shape or shapes. In one or more embodiments, the battery compartment 162 can take a shape that is adapted to receive the battery door 170. The battery compartment 162 can also include the hinge 172 adapted to connect the faceplate 160 to the battery door 170. In one or more embodiments, the hearing device 100 does not include a faceplate 160 such that the battery compartment 162 is disposed in the first end 104 of the housing 102, and the hinge 172 connects the battery door 170 to the first end of the housing.

Figure 8:
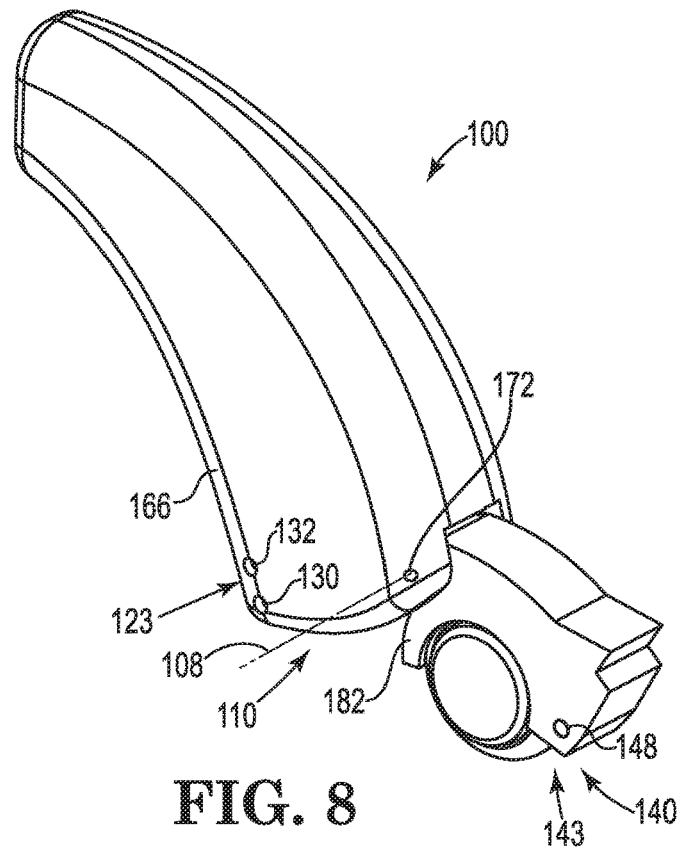
FIG. 8 is a left-side perspective view of the hearing device of FIG. 5.

The battery door 170 of the assembly 100 is adapted to be received within the battery compartment 162. As shown in FIGS. 7-8, the battery door 170 includes a first sidewall 180 and a second sidewall 182. The first and second sidewalls 180, 182 can take any suitable shape or shapes. As can be seen in FIG. 7, the battery door 170 is connected to the housing 102 by the hinge 172 that rotates about a hinge axis 108.

The hearing device 100 also includes the detent assembly 110 connected to the battery compartment 162 and the battery door 170. The detent assembly 110 includes a base 120 that includes a first magnetic region 124 and a second magnetic region 126. The first and second magnetic regions 124, 126 are disposed on the first sidewall 164 of the battery compartment 162. Further, the base 120 can also include a third magnetic region 130 and a fourth magnetic region 132 disposed on the second sidewall 166 of the battery compartment 162. Each of the magnetic regions 124, 126, 130, 132 (collectively magnetic regions 123) includes a magnetic polarity.

The detent assembly 110 also includes an actuator 140 that includes a magnetic region 144 disposed on the first sidewall 180 of the battery door 170. In one or more embodiments, the actuator 140 also includes a second magnetic region 148 disposed on or in the second sidewall 182 of the battery door 170. Each of the first and second magnetic regions 144, 148 (collectively magnetic regions 143) each includes a magnetic polarity.

The first and second magnetic regions 124, 126 of the base 120 face the magnetic region 144 of the actuator 140 when the battery door 170 is disposed within the battery compartment 162, i.e., when the battery door is in either the intermediate or closed position. Further, the third and fourth magnetic regions 130, 132 of the base 120 face the second magnetic region 148 of the actuator 140 when the battery door 170 is disposed within the battery compartment 162.

In one or more embodiments, the first and second magnetic regions 124, 126 of the base 120 and the magnetic region 144 of the actuator 140 can have the same polarity. Further, in one or more embodiments, the third and fourth magnetic regions 130, 132 of the base 120 and the second magnetic region 148 of the actuator 140 can also have the same polarity.

The first and second magnetic regions 124, 126 of the base 120 repel the magnetic region 144 of the actuator 140 to define detent positions between the base and actuator as is described herein regarding detent assembly 10 of FIGS. 1-4. Further, the third and fourth magnetic regions 130, 132 of the base 120 repel the second magnetic region 148 of the actuator 140 to also provide detent positions between the base and the actuator. In one or more embodiments, detent positions defined by the first and second magnetic regions 124, 126 of the base 120 and the magnetic region 144 of the actuator 140 are aligned with the detent positions defined by the third and fourth magnetic regions 130, 132 of the base and the second magnetic region 148 of the actuator 140.

Figure 11:
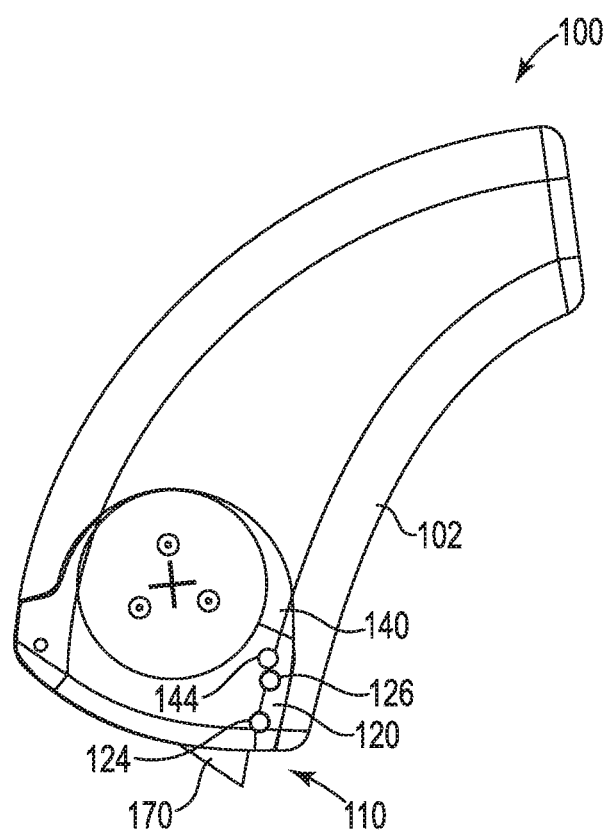
FIG. 11 is a plan view of the hearing device of FIG. 5 with the detent assembly in a third detent position.

The detent assembly 110 can define any suitable number of detent positions. For example, the detent assembly 110 includes a first detent position (FIGS. 7-9), a second detent position (FIG. 10), and a third detent position (FIG. 11). When the detent assembly 110 is in the first detent position, the first magnetic region 124 of the base 120 is disposed between the magnetic region 144 of the actuator 140 and the second magnetic region 126 of the base when the magnetic regions are projected onto a plane that is parallel to surfaces of the magnetic regions as is shown in FIG. 9. Further, when the detent assembly 110 is in the second detent position, the magnetic region 144 of the actuator 140 is disposed between the first and second magnetic regions 124, 126 of the base 120 as is shown in FIG. 10. And when the detent assembly 110 is in the third detent position, the second magnetic region 126 of the base 120 is disposed between the first magnetic region 124 of the base and the magnetic region 144 of the actuator 140.

In embodiments where the base 120 includes third and fourth magnetic regions 130, 132 and the actuator 140 includes the second magnetic region 148, the third magnetic region of the base is disposed between the second magnetic region of the actuator and the second magnetic region of the base (when the magnetic regions are projected onto a plane that is parallel to surfaces of the magnetic regions as is shown in FIG. 9) when the detent assembly 110 is in the first detent position. Further, when in the second detent position, the second magnetic region 148 of the actuator 140 is disposed between the third and fourth magnetic regions 130, 132 of the base 140. And when in the third detent position, the fourth magnetic region 132 of the base 120 is disposed between the third magnetic region 130 of the base and the second magnetic region 148 of the actuator 140.

In one or more embodiments, the hearing device 100 can also include a switch 190 (FIG. 6) that is electrically connected to electronic components 192 disposed in the housing 102. The switch 190 forms part of a circuit connected to the electronic components 192 and the battery 194 of the electronic components. Generally, the switch includes an off position, where the battery 194 is not electrically connected to the electronic components 192 (i.e., the switch electrically disconnects the battery and the electronic components), and an on position, where the battery is electrically connected to the electronic components such that power from the battery is provided to the components.

The hearing assistance device 100 can include any suitable electronic components 192. For example, the electronic components 192 can include one or more integrated circuits, power sources, microphones, receivers, etc. Further, for example, the components 192 can include a controller, a microphone, a receiver (e.g., speaker), a battery 194, an antenna, and one or more sensors. The microphone, receiver, battery 194, antenna, and sensors can be electrically connected to the controller using any suitable technique or techniques.

The battery 194 can include any suitable power source or power sources. In one or more embodiments, the battery 194 can include a rechargeable battery. In one or more embodiments, the components 192 can include two or more power sources.

The switch 190 can be operatively connected to the battery door 170 such that the position of the door can manipulate the switch between the off and on positions. For example, when the battery door 170 is in the open position or in the intermediate position, the switch 190 is in the off position such that the battery 194 is disconnected from the electronic components 192. When the door 170 is manipulated from the intermediate position to the closed position, the switch 184 is manipulated from the off position to the on position such the switch electrically connects the battery 194 and the electronic components 192.

The detent positions defined by the detent assembly 110 can be correlated to the positions of the battery door and the switch 190 such that the detent positions indicate to the wearer the status of the battery door and the activation or deactivation of the electronic components 192. For example, the first detent position as shown in FIGS. 7-9 can indicate to the wearer that that the battery door 170 is open and the device 100 is in a position that the battery 194 can be disposed in the battery door or the battery compartment 162, or that the battery can be replaced. The battery door 170 is in the intermediate position (FIG. 10), when the detent assembly 110 is in the second detent position. The second detent position indicates to the wearer that the battery door 170 is in the intermediate position and the switch is in the off position. Further, the battery 194 remains disposed in the battery compartment 162 when the detent assembly 110 is in the second detent position. The third detent position (FIG. 11) can indicate to the wearer that the battery door 170 is in the closed position and the switch 190 is in the on position.

All references and publications cited herein are expressly incorporated herein by reference in their entirety into this disclosure, except to the extent they may directly contradict this disclosure. Illustrative embodiments of this disclosure are discussed and reference has been made to possible variations within the scope of this disclosure. These and other variations and modifications in the disclosure will be apparent to those skilled in the art without departing from the scope of the disclosure, and it should be understood that this disclosure is not limited to the illustrative embodiments set forth herein. Accordingly, the disclosure is to be limited only by the claims provided below.

What is claimed is:

1. A detent assembly comprising:
   a base comprising a major surface, a first magnetic region, and a second magnetic region, wherein the first and second magnetic regions are disposed on or within the major surface, and further wherein each of the first and second magnetic regions comprises a magnetic polarity; and
   an actuator connected to the base and comprising a major surface and a magnetic region disposed on or within the major surface, wherein the magnetic region of the actuator comprises the same magnetic polarity as the magnetic polarity of the first and second magnetic regions of the base;
   wherein the base and the actuator are adapted to move relative to each other about a single axis of rotation, wherein the first and second magnetic regions of the base repel the magnetic region of the actuator to define detent positions between the base and the actuator, and further wherein the magnetic region of the actuator is aligned with a non-magnetic region of the base when the actuator is in a detent position of the detent positions defined between the base and the actuator.

2. The assembly of claim 1, wherein the first and second magnetic regions of the base comprise magnets.

3. The assembly of claim 1, wherein the magnetic region of the actuator comprises a magnet.

4. The assembly of claim 1, wherein the detent positions comprise a first detent position, a second detent position, and a third detent position, wherein when in the first detent position the first magnetic region of the base is disposed between the magnetic region of the actuator and the second magnetic region of the base, wherein when in the second detent position the magnetic region of the actuator is disposed between the first and second magnetic regions of the base, and further wherein when in the third detent position the second magnetic region of the base is disposed between the first magnetic region of the base and the magnetic region of the actuator.

5. The assembly of claim 1, wherein the base comprises a cavity and the major surface of the base forms at least a portion of an inner surface of the cavity, wherein the actuator is connected to the base such that the actuator is received within the cavity of the base.

6. The assembly of claim 5, wherein the base comprises a second major surface that along with the major surface of the base forms the inner surface of the cavity, wherein the actuator further comprises a second major surface.

7. The assembly of claim 6, wherein the base comprises a third magnetic region and a fourth magnetic region, wherein the third and fourth magnetic regions are disposed on the second major surface of the base, and further wherein each of the third and fourth magnetic regions of the base comprises the same magnetic polarity as the magnetic polarity of the first and second magnetic regions of the base.

8. The assembly of claim 7, wherein the actuator comprises a second magnetic region disposed on the second major surface of the actuator, wherein the second magnetic region comprises the same magnetic polarity as the magnetic polarity of the third and fourth magnetic regions of the base.

9. The assembly of claim 1, wherein the actuator is connected to the base by a hinge.

10. A hearing device comprising:
a housing;
a faceplate connected to the housing;
a battery compartment comprising first and second sidewalls and an opening in the faceplate;
a battery door connected to the faceplate by a hinge, wherein the battery door comprises a closed position and an open position, wherein when in the closed position the battery door substantially occludes the opening in the faceplate, and further wherein when in the open position the battery door allows access to a battery disposed in the battery door; and
a detent assembly connected to the battery compartment and the battery door, wherein the detent assembly comprises:
a base comprising a first magnetic region and a second magnetic region, wherein the first and second magnetic regions are disposed on or within the first sidewall of the battery compartment, and further wherein each of the first and second magnetic regions comprises a magnetic polarity;
an actuator comprising a magnetic region disposed on or within a sidewall of the battery door, wherein the magnetic region of the actuator comprises the same magnetic polarity as the magnetic polarity of the first and second magnetic regions of the base;
wherein the base and the actuator are adapted to move relative to each other, and further wherein the first and second magnetic regions of the base repel the magnetic region of the actuator to define detent positions between the base and the actuator.

11. The device of claim 10, wherein the base further comprises third and fourth magnetic regions disposed on the second sidewall of the battery compartment, wherein each of the third and fourth magnetic regions comprises the same magnetic polarity as the magnetic polarity of the first and second magnetic regions of the base, and further wherein the actuator comprises a second magnetic region disposed on a second sidewall of the battery door, wherein the second magnetic region comprises the same magnetic polarity as the magnetic polarity of the third and fourth magnetic regions of the base.

12. The device of claim 11, wherein the battery is disposed in the battery compartment when the battery door is in the closed position, wherein the device further comprises a switch electrically connected to electronic components disposed in the housing, wherein the switch comprises an on position and an off position, wherein the switch is in the on position when the battery door is in the closed position, wherein the switch is in the off position when the battery door is in the open position, wherein when in the on position the switch electrically connects the battery and the electronic components, and further wherein when in the off position the switch electrically disconnects the battery and the electronic components.

13. The device of claim 12, wherein the battery door further comprises an intermediate position, wherein the switch is in the off position when the battery door is in the intermediate position.

14. The device of claim 13, wherein the detent positions comprise a first detent position, a second detent position, and a third detent position, wherein when in the first detent position the first magnetic region of the base is disposed between the magnetic region of the actuator and the second magnetic region of the base, wherein when in the second detent position the magnetic region of the actuator is disposed between the first and second magnetic regions of the base, and further wherein when in the third detent position the second magnetic region of the base is disposed between the first magnetic region of the base and the magnetic region of the actuator.

15. The device of claim 14, wherein the battery door is in the closed position when the detent assembly is in the third detent position.

16. The device of claim 14, wherein the battery door is in the intermediate position when the detent assembly is in the second detent position.

17. The device of claim 14, wherein the switch is in the on position when the detent assembly is in third detent position.

18. The device of claim 14, wherein the switch is in off position when detent assembly is in first and second detent positions.

19. A detent assembly comprising:
a base comprising:
a first magnetic region and a second magnetic region disposed on or within a major surface, wherein each of the first and second magnetic regions comprises a magnetic polarity,
a third magnetic region and a fourth magnetic region disposed on a second major surface, wherein each of the third and fourth magnetic regions comprises the same magnetic polarity as the magnetic polarity of the first and second magnetic regions; and
a cavity comprising an inner surface formed by the major surface and the second major surface; and
an actuator connected to the base, the actuator comprising:
a magnetic region disposed on or within a major surface, and
a second magnetic region disposed on or within a second major surface;
wherein the actuator is connected to the base such that the actuator is received within the cavity of the base, and wherein the base and the actuator are adapted to move relative to each other;
wherein the magnetic region of the actuator comprises the same magnetic polarity as the magnetic polarity of the first and second magnetic regions of the base, and wherein the second magnetic region of the actuator comprises the same magnetic polarity as the magnetic polarity of the third and fourth magnetic regions of the base, and further wherein the first and second magnetic regions of the base repel the magnetic region of the actuator to define detent positions between the base and the actuator.

* * * * *